United States Patent
Stamper

[11] Patent Number: 6,111,301
[45] Date of Patent: Aug. 29, 2000

[54] INTERCONNECTION WITH INTEGRATED CORROSION STOP

[75] Inventor: Anthony K. Stamper, Williston, Vt.

[73] Assignee: International Business Machines Corporation, Armonk, N.Y.

[21] Appl. No.: 09/066,121

[22] Filed: Apr. 24, 1998

[51] Int. Cl.[7] .......................... H01L 29/00; H01L 23/48; H01L 23/52; H01L 29/40

[52] U.S. Cl. ......................... 257/529; 257/753; 257/758; 257/761; 257/762; 257/764; 257/765; 257/771

[58] Field of Search ..................................... 257/529, 530, 257/751, 753, 758, 761, 762, 764, 765, 767, 771

[56] References Cited

U.S. PATENT DOCUMENTS

| | | |
|---|---|---|
| 5,262,354 | 11/1993 | Cote et al. ............................. 437/195 |
| 5,300,813 | 4/1994 | Joshi et al. ............................. 257/752 |
| 5,399,507 | 3/1995 | Sun ............................................. 437/24 |
| 5,599,747 | 2/1997 | Bhatt et al. ............................. 437/209 |
| 5,612,254 | 3/1997 | Mu et al. ................................ 437/195 |
| 5,712,206 | 1/1998 | Chen ....................................... 257/529 |
| 5,760,674 | 6/1998 | Gilmour et al. ....................... 257/529 |
| 5,851,903 | 12/1998 | Stamper ................................. 438/467 |

*Primary Examiner*—Steven H. Loke
*Attorney, Agent, or Firm*—Pollock, Vande Sande & Amernick; Howard J. Walter, Jr.

[57] ABSTRACT

An interconnection structure for a semiconductor circuit is provided employing a conductor structure electrically connected to conductive wiring located on a different level than the conductor structure. The conductor structure comprises a relatively low resistivity metal. A barrier layer of a corrosion resistant metal is located intermediate the relatively low resistivity metal and wiring to thereby separate the wiring and relatively low resistivity metal.

9 Claims, 3 Drawing Sheets

INTERCONNECTION WITH INTEGRATED CORROSION STOP

DESCRIPTION

1. Technical Field

The present invention generally relates to a semiconductor circuit and, more particularly, to an interconnect structure wherein corrosion protection is provided to the interconnect structure. The present invention is especially concerned with a copper fuse structure.

2. Background of Invention

Current aluminum and oxide-based interconnect structures utilize laser fuse blow of metal interconnect lines for redundancy and identification. The inherently strong passivating oxide formed on aluminum during fuse blow provides excellent corrosion resistance for the blown fuse structure. However, this is not the case with respect to copper interconnect lines which have a weak passivating oxide and high corrosion susceptibility. The weak passivating oxide and high corrosion susceptibility necessitate a new fuse blow scheme for use with interconnect structures.

A copper wire used as a fusible link will corrode when opened by laser ablation and that corrosion will tend to spread to other integrated circuits, thus creating a potential reliability failure. In fact, a suitable fuse for the planar copper back end of line (BEOL) is one of the outstanding issues associated with the manufacturability of the copper BEOL technology. Blown fuses are exposed to an oxidizing ambient and processing chemicals. Since copper, as mentioned above, readily oxidizes in a non-self-limiting reaction, standard long fused or short fused designs used in the oxide/aluminum system have increased risk when translated to the copper BEOL.

When a laser-blown fusible metal link is exposed to ambient, it corrodes. This corrosion is not self limiting and can proceed thousands of microns in the absence of a corrosion barrier. Standard damascene copper wiring typically employs physical vapor deposited barrier films between the copper wiring levels. These barrier films have poor conformality, particularly in the via or trench corners, and are poor barriers to copper corrosion. A corroded copper line or via will put stress on the corner of the trench where the PVD barrier film is thinnest. This stress will break through the PVD barrier and the corrosion will continue unabated at the next copper wiring level.

SUMMARY OF INVENTION

It is therefore an object of the present invention to provide a corrosion resistant integrated fuse especially for the planar copper BEOL. It is an object of the present invention to provide a fuse structure of a relatively low resistivity metal such as copper that exhibits integrated corrosion stop.

The present invention makes it possible to electrically interconnect directly the fuse structure to wiring located on a different level without the necessity of including an intermediate via to act as a corrosion barrier.

According to the present invention, an interconnection structure for a semiconductor circuit is provided that includes a fuse structure electrically connected to conductive wiring located on a different level than the fused structure. The fuse structure comprises a relatively low resistivity metal. A barrier layer of a corrosion resistant metal is located intermediate the relatively low resistivity metal and wiring to thereby physically separate the wiring and relatively low resistivity metal.

According to another feature of the present invention, an interconnection structure for a semiconductor circuit is provided employing a conductor structure electrically connected to conductive wiring located on a different level than the conductor structure. The conductor structure comprises a relatively low resistivity metal. A barrier layer of a CVD deposited corrosion resistant metal is located intermediate the relatively low resistivity metal and wiring to thereby physically separate the wiring and relatively low resistivity metal.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures which illustrate various embodiments of the present invention and wherein the same numeral represents the same component in various figures.

Figure 1:
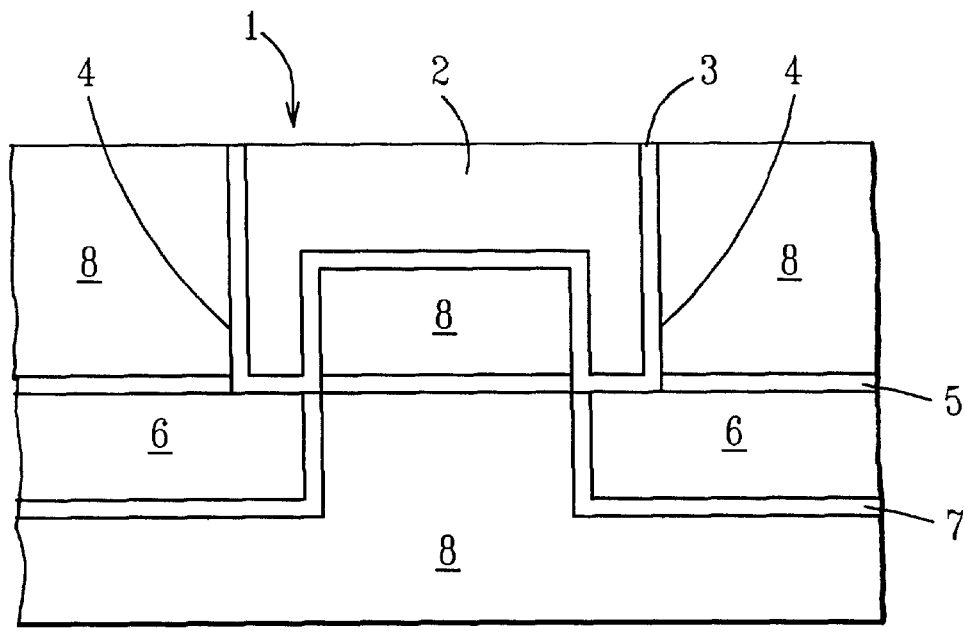
FIG. 1 is a schematic diagram of a fuse structure using an upper wiring element as the fusible link and a dual damascene via in accordance with the present invention.

FIG. 1 illustrates one embodiment of the present invention whereby a fusible conductor 1 includes a relatively low resistivity metal 2 such as copper. The fuse also includes a barrier layer 3 of a corrosion resistant metal. The corrosion resistant layer 3 is deposited using a conformal method, such as chemical vapor deposition, ionized physical vapor deposition, or long-throw physical vapor deposition, such that it completely fills the bottom of the via or trench. CVD metals, such as tungsten (W) or titanium nitride (TiN), achieve conformal coating, particularly in the corners between the metal layers 2 and 6, thus preventing a continuous path for corrosion. Layers 2 and 6 can be copper, aluminum or copper-aluminum alloys. Film 5, which is only required if film 8 either will not adhere to wire 6 or if film 8 is a poor barrier to copper diffusion, is a dielectric insulator such as silicon nitride or hydrogenated silicon nitride. Film 8 is an intermetal dielectric such as silicon dioxide. FIG. 1 shows a dual damascene embodiment where there is no interface between the copper wire 2 and the via 4. Layer 7 is a liner or copper diffusion barrier such as tantalum or tantalum nitride.

Figure 2:
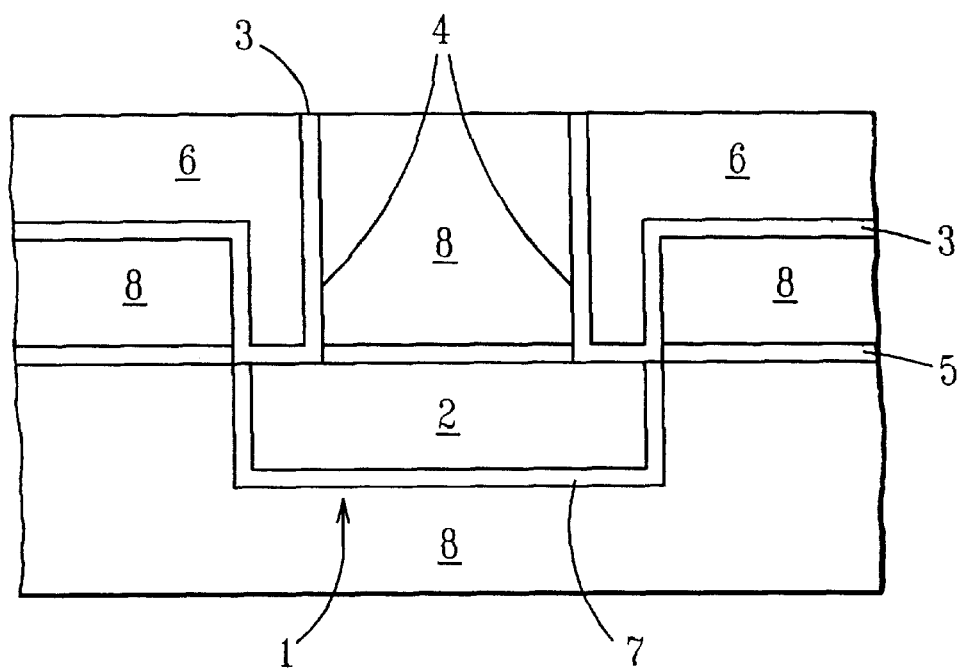
FIG. 2 is a schematic diagram of an alternative fuse structure using a lower wiring element as the fusible link and a dual damascene via in accordance with the present invention.

FIG. 2 is a further variation of the fusible structure according to the present invention in which the fusible link 1 is located beneath the via 4. The fusible link 1 is a combination of numerals 2 and 7. The fuse link 1 is prevented from corroding the attached metal conductor 6 by the conformal corrosion barrier 3. The other metal and insulator films in FIG. 2 have been described in the previous paragraph.

Figure 3:
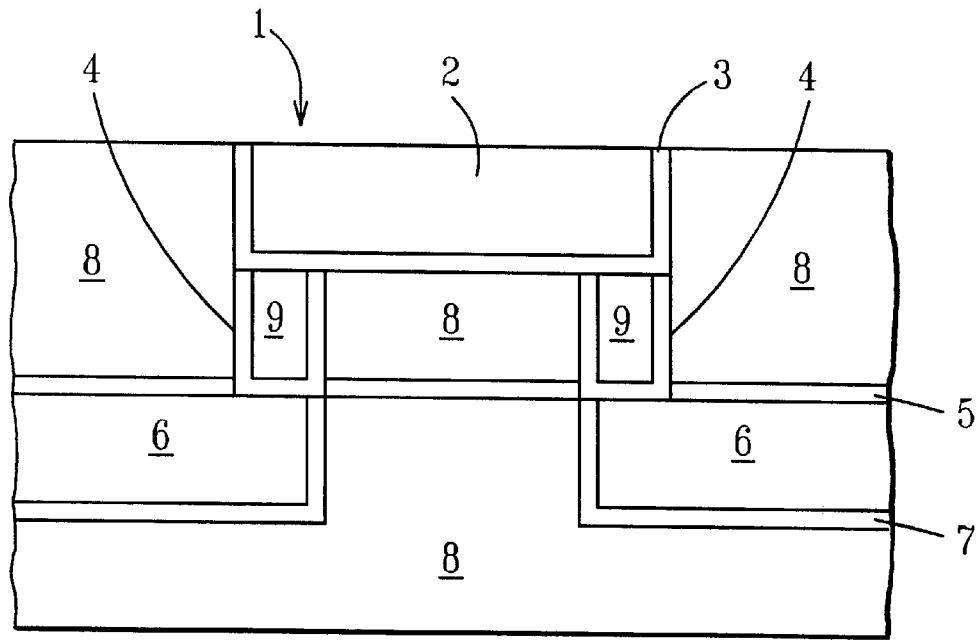
FIGS. 3 and 4 are still further alternative fuse structures pursuant to the present invention wherein the via is fabricated using single damascene.
Figure 4:
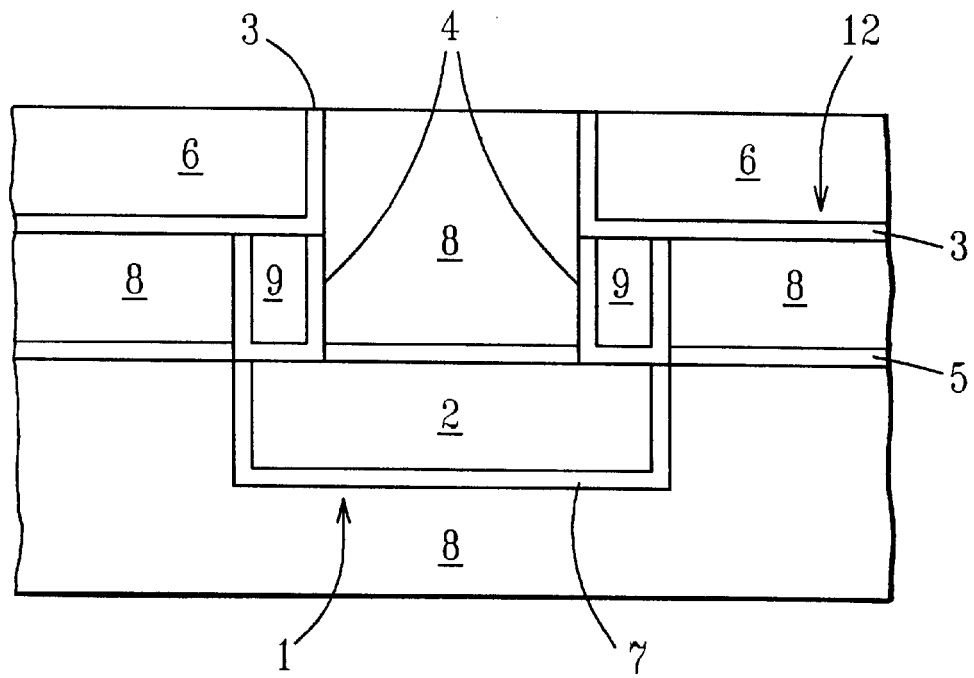

FIGS. 3 and 4 illustrate additional embodiments of the upper wire fuse wherein the via is fabricated using single damascene. The copper corrosion barrier 3 can be located either in the wire (FIG. 3) or in the via (FIG. 4). In FIGS. 3 and 4, numeral 9 represents a relatively low resistivity metal such as copper. The layer 3 in FIGS. 1–4 is typically greater than 1 nm and more typically about 40 nm to 150 nm thick. The metal layers 2 and 6 are typically about 200 m to 3000 nm thick. In FIG. 4, numeral 12 refers to the fusible link which is a combination of 3 and 6. FIGS. 1–4 show a via 4 between the two wiring levels. Although a via would be used in most applications, it is not required and the two wiring levels could be directly wired without a via.

Figure 5A:
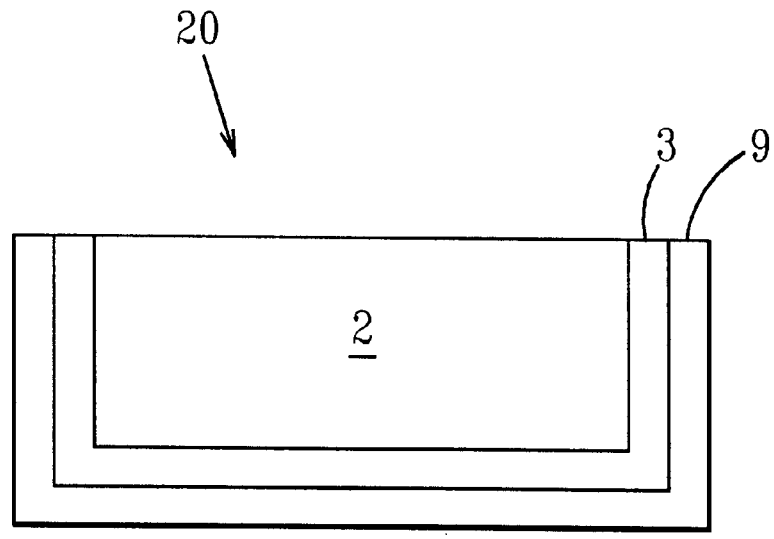
FIGS. 5a and 5b are partial schematics of further fuse structure pursuant to the present invention.
Figure 5B:
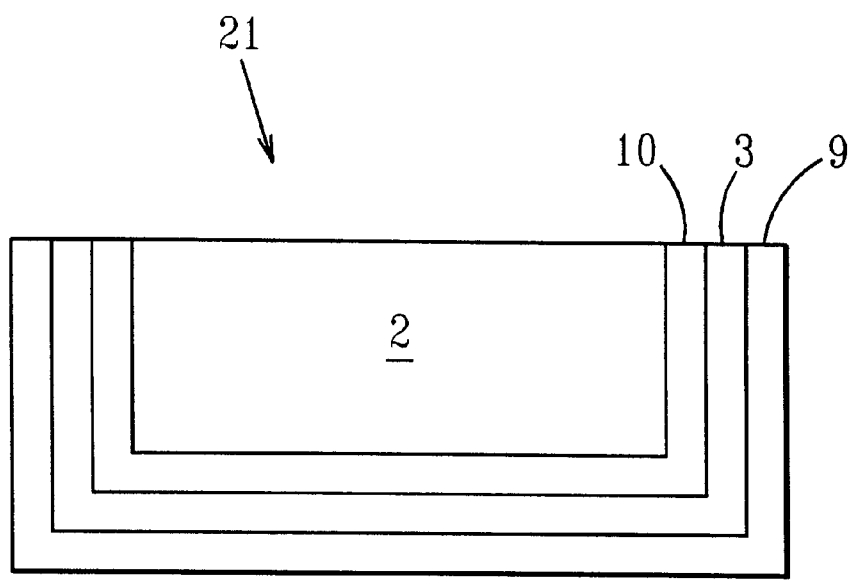

FIGS. 5a and 5b are partial schematic diagrams of fusible conductor wires 20 and 21, respectively according to the present invention, it being understood that the fusible conductor 20 of FIG. 5a and 21 of FIG. 5b can be used as the wire or via in any of the exemplified embodiments illustrated in FIGS. 1–4. In FIG. 1, 1 can be substituted with 20 or 21 of FIG. 5a or FIG. 5b, in FIG. 2, 4 can be substituted with 20 or 21, in FIG. 3, 1 and/or 4 can be substituted with 20 or 21, and in FIG. 4, 4 and/or 12 can be substituted with 20 or 21. The fusible conductor 20 (see FIG. 5a) includes a relatively low resistivity metal 2 such as copper. It also includes a corrosion barrier containing the corrosion resistant metal 3, along with adhesion promoter and diffusion barrier coplanar layer 9 such as tantalum nitride or tantalum. The adhesion promoting layer is typically about 5 nanometers to about 1000 nanometers thick. The adhesion promoter and diffusion barrier include TaN, TiN, obtained by PVD or sputtered tungsten.

If the corrosion resistant metal 3 and the low resistivity metal 2 must be segregated to prevent interdiffusion or poor adhesion than the addition of a diffusion barrier or adhesion promoter layer 10 such as Ta or TaN can be used (see FIG. 5b). The layer 10 is typically about 5 nanometers to about 100 nanometers and applied by PVD.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An interconnection structure for a semiconductor circuit comprising:

(A) a fuse structure; and (B) conductive wiring located on a different level than said fuse structure; wherein said fuse structure is electrically connected to said conductive wiring and wherein said fuse structure comprises a relatively low resistivity metal; and (C) a conformal barrier layer of a chemical vapor deposited corrosion resistant metal conductively contacting said relatively low resistivity metal and wherein said barrier layer of a corrosion resistant metal is located intermediate said relatively low resistivity metal and said wiring and along the sides of said relatively low resistivity metal thereby separating said wiring from said relatively low resistivity metal.

2. The interconnection structure of claim 1 wherein said low resistivity metal is located on top of said barrier layer.

3. The interconnection structure of claim 2 wherein said fuse structure further comprises adhesion promoting layer or diffusion barrier between said low resistivity metal and said corrosion resistant metal.

4. The interconnection structure of claim 3 wherein said adhesion promoting layer includes tantalum nitride.

5. The interconnection structure of claim 1 wherein said low resistivity metal is copper.

6. The interconnection structure of claim 5 wherein said corrosion resistant metal is tungsten.

7. The interconnection structure of claim 6 wherein said tungsten is chemical vapor deposited tungsten.

8. The interconnection structure of claim 1 further comprising via between the different levels.

9. The interconnection structure of claim 1 wherein the fuse structure is located in a trench in the interconnection structure and said conformal barrier layer is located adjacent the side walls and bottom of the trench.

* * * * *